United States Patent [19]

Webb et al.

[11] Patent Number: 4,745,451
[45] Date of Patent: May 17, 1988

[54] PHOTODETECTOR ARRAY AND A METHOD OF MAKING SAME

[75] Inventors: Paul P. Webb, Beaconsfield; Robert J. McIntyre, Pointe-Claire, both of Canada

[73] Assignee: RCA Corporation, Del.

[21] Appl. No.: 510,172

[22] Filed: Jul. 1, 1983

[51] Int. Cl.[4] ............... H01L 27/14; H01L 31/00
[52] U.S. Cl. ................................................ 357/30
[58] Field of Search ..................... 357/30, 32, 55; 136/246; 250/353, 371

[56] References Cited

U.S. PATENT DOCUMENTS

| | | | |
|---|---|---|---|
| 3,150,999 | 9/1964 | Rudenberg et al. | 136/89 |
| 3,293,440 | 12/1966 | Mueller | 250/211 |
| 3,615,853 | 10/1971 | Goldsmith et al. | 136/89 |
| 3,714,491 | 1/1973 | McIntyre et al. | 313/96 |
| 4,135,950 | 1/1979 | Rittner | 136/89 SJ |
| 4,283,589 | 8/1981 | Kaplow et al. | 357/30 |

Primary Examiner—William L. Sikes
Assistant Examiner—Robert E. Wise
Attorney, Agent, or Firm—Raymond A. Eckersley

[57] ABSTRACT

A photodetector array having reflector means positioned over the low response regions between elements of the array. Light incident on the reflector means is reflected into a high response region of the array. The invention also includes a method of forming the reflector means comprising the steps of forming wedge-shaped projections on the surface of a mold, coating the projections with a reflective material, filling the space between the coated projections with a transparent material and separating the mold from the material with the reflective layer adhered to the material.

11 Claims, 2 Drawing Sheets

PHOTODETECTOR ARRAY AND A METHOD OF MAKING SAME

The invention relates to a photodetector array having reduced low response regions between elements of the array and a method for making this array.

BACKGROUND OF THE INVENTION

A photodetector array comprises a plurality of spaced-apart elements, such as P-I-N or avalance detectors, in a quadrant, linear, or rectangular arrangement. The spacing between the elements of the array is kept as small as possible, consistent with electrical isolation of the elements, in order to increase the position-sensing capability of the array and to decrease the loss of carriers generated by light incident on the array between the elements. For an avalanche photodiode array the avalanche gain is also reduced because the electric field in the region between the elements is greatly reduced. Thus such arrays have high response regions about the P-N junctions of the elements in which photogenerated charge undergoes high avalanche gain. Between these high response regions are low response regions in which the gain is reduced to about unity corresponding to, but wider than, the regions between the elements.

McIntyre et al. in U.S. Pat. No. 4,458,260, filed Nov. 20, 1981 and incorporated herein by reference, have disclosed an avalanche photodiode array wherein the spacing between the elements has been reduced to a width of approximately 75 micrometers ($\mu$m). While alternative fabrication procedures may be possible to reduce the width of this region, it is unlikely that it can ever be eliminated. Such wide low response regions, particularly for an avalanche photodiode array, are unacceptable in many applications.

SUMMARY OF THE INVENTION

A photodiode array comprises a plurality of spaced-apart elements in a light-sensitive body, each element comprising a semiconductor junction and a high response region about said junction wherein photogenerated charge is collected with high efficiency or, in the case of an avalanche detector, high multiplication and low response regions, having a lower efficiency or low multiplication for charge collection, between said junctions. The invention is an improved photodetector array wherein the improvement comprises reflector means positioned over the low response regions whereby light incident on the reflector means is reflected into a high response region.

The invention also includes a method of fabricating a reflector body which includes the steps of forming a plurality of wedge-shaped projections on the surface of a mold; coating the side surfaces of the projections with a light reflective material; filling the space between the projections with a transparent material; separating the transparent material with the reflective layer adhered thereto from the mold; and positioning the transparent material on the light entry surface of the photodetector array with the coated projections over the low response regions.

DETAILED DESCRIPTION OF PREFERRED EMBODIMENTS

Figure 1:
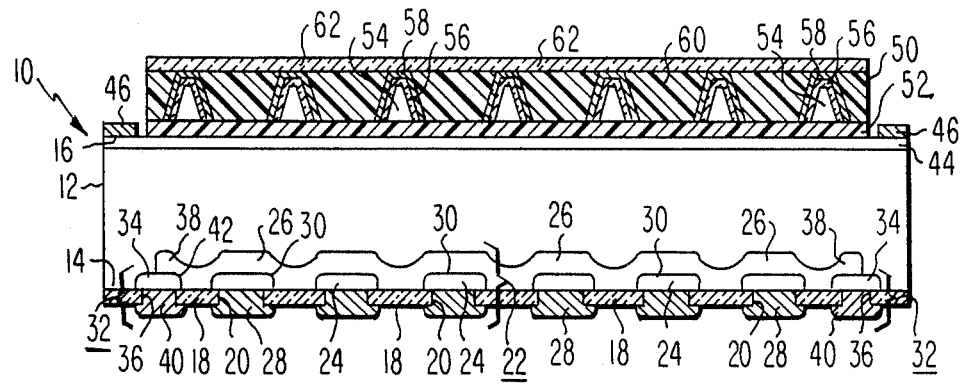
FIGS. 1 and 2 are cross-sectional views of two different embodiments of the photodetector array of the invention.

A photodetector array 10 in the form of an avalanche photodiode array is shown in FIG. 1. The array 10 includes a light-sensitive semiconductor body 12 of $\pi$-type conductivity having opposed major surfaces 14 and 16. A passivation layer 18 having a plurality of openings 20 therethrough overlies the major surface 14. Each element 22 of the array is composed of an N-type conductivity region 24, a P-type conductivity region 26 and an electrical contact 28 to the N-type region 24 in the openings 20 in the passivation layer 18. P-N junctions 30 of the elements 22 are formed at the interface between the N-type region 24 and the P-type region 26. The N-type regions 24 extend along the surface 14 towards but do not contact one another. The P-type regions 26, which contain a non-uniform, uncompensated concentration of acceptors, extend a further distance into the body 12 from the N-type regions 24 and overlap one another in the regions between the N-type regions 24. A guard ring 32 extends about the periphery of the array and includes an N-type guard ring region 34 extending a distance into the body 12 from the surface 14 in the region of the guard ring opening 36 in the passivation layer 18 a P-type guard ring region 38, and a guard ring electrical contact 40. The P-type guard ring region 38 contans an excess uncompensated concentration of acceptors, extends a further distance into the body 12 from a portion of the N-type guard ring region 34 and overlaps the P-type region 26 on at least a portion of the periphery of the array. The guard ring electrical contact 40 overlies the N-type guard ring region 34 in the guard ring opening 36 in the passivation layer 18. A guard ring P-N junction 42 is thus formed at the interface between the N-type and P-type guard ring regions 34 and 38 respectively. A P$^+$-type contacting region 44, containing an excess concentration of acceptors, extends a distance into the body 12 from the surface 16. An electrical contact 46 overlies a portion of the surface 16 and makes electrical contact to the contacting region 44.

A reflector body 50 overlies the major surface 16 of the array 10 and is adhered to the surface 16 using an adhesive layer 52. The reflector body 50 includes a plurality of spaced-apart wedges 54, a layer of an etch-resistant material 56 on the surface of each wedge 54 and a reflective coating 58 over the etch-resistant layer 56. A transparent material 60 fills the space between the wedges and a transparent plate 62 overlies the wedges 54 and the transparent material 60. The reflector body 50 is so positioned on the surface 16 that the wedges 54 are located over the low response regions between the P-N junctions 30.

Figure 2:
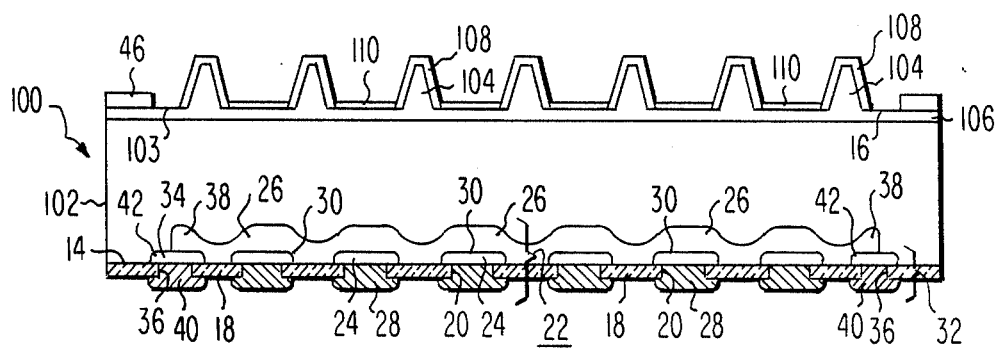

In FIG. 2 the identification of those elements common to the array 100 of FIG. 2 and the array 10 of FIG. 1 is the same. The photodetector array 100 differs from the photodetector array 10 in that the reflectors are an integral part of a light-sensitive semiconductor body 102. The reflectors comprise a plurality of wedges 104 projecting outwards from the major surface 103 of the semiconductor body 102. These wedges 104 are positioned over the regions between the P-N junctions 30. A P$^+$-type contacting region 106 extends a distance into the body from the flat portions of the surface 103 and also includes those portions of the body in the wedges 104. A light-reflective coating 108 overlies the surfaces of the wedges 104. An antireflection coating 110 overlies the flat portions of the surface 103 between the wedges 104.

McIntyre et al. in U.S. Pat. No. 4,458,260 have disclosed a method of fabrication for a semiconductor body with regions of different conductivity type therein. The fabrication of quadrant-type avalanche photodetectors have been disclosed by McIntyre et al. in U.S. Pat. No. 3,714,491, incorporated herein by reference. It is to be understood that the scope of the invention includes all types of photodetector arrays having low response regions between the elements of the array. The fabrication of other photodetector arrays such as P-N and P-I-N photodiodes and CCD arrays are well known in the art. For example, a P-I-N photodetector array will be formed if the P-type regions 26 are omitted in the fabrication of the array shown in FIG. 1.

Figure 3:
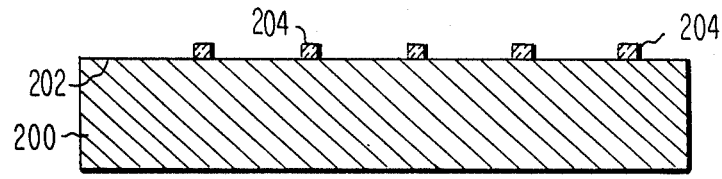
FIGS. 3–7 are cross-sectional views of a reflector body at different steps during the fabrication process.
Figure 4:
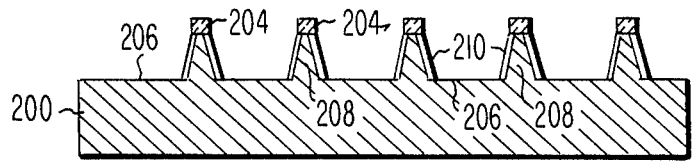

The reflector 50 of the array 10 may be fabricated using the sequence of steps illustrated in FIGS. 3-7 where elements common to these Figures have the same identification. In FIG. 3, a mold in which the wedges are to be formed is designated as 200. A silicon mold having a first major surface 202 which is a {100} crystallographic plane is preferred. A mask structure 204 in the form of stripes composed of an etch-resistant material, such as $SiO_2$, overlies the surface 202. The mask is formed using well known deposition methods and patterned using standard photolithographic methods. The spacing and shape of the stripes in the mask conform to the spacing and shape of the low response regions of the array with which the reflector 50 is to be used. The stripes are preferentially oriented parallel to (110) crystallographic directions so that the sides of the wedges will be {111} planes.

The major surface 202 is then etched with a preferential etch such as one containing 35 grams of NaOH in a solution containing 700 ml of $H_2O$ and 150 ml of methanol. The etching step forms wedges 208 of material projecting outwards from a new surface 206 of the mold 200. If the surface of the mold 200 is a {100} plane, then the side surfaces 210 of the wedges are {111} planes. For the array 10 shown in FIG. 1 and described in U.S. patent application Ser. No. 323,200, the spacing of the wedges is preferably about 300 μm, their base width is about 100 μm, and their height is about 70 μm.

Figure 5:
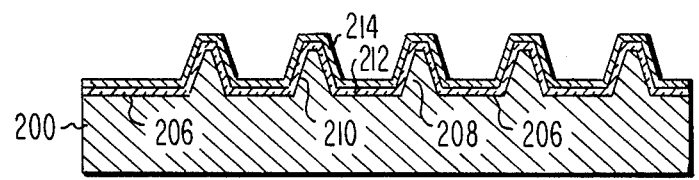

As shown in FIG. 5, the surface 206 and the surfaces of the wedges 210 are sequentially coated with a layer of etch-resistant material 212, such as thermally grown $SiO_2$ about 1 μm thick, and a layer of reflective material 214, such as aluminum about 0.2 μm thick, deposited using well known vacuum evaporation techniques.

Figure 6:
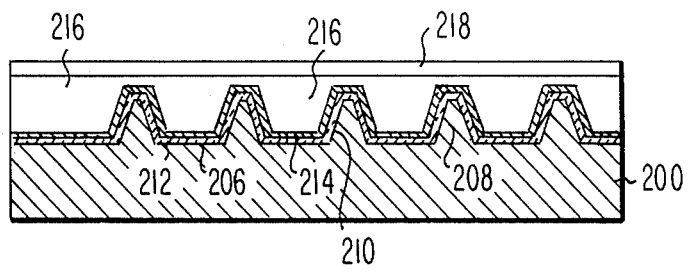

The regions between the wedges 208 over the reflective layer 214 are then filled with a substantially transparent material 216, such as an epoxy resin, as shown in FIG. 6. A transparent plate 218, such as a glass plate about 150 μm thick, is then placed on the transparent material 216 to provide reinforcement.

Figure 7:
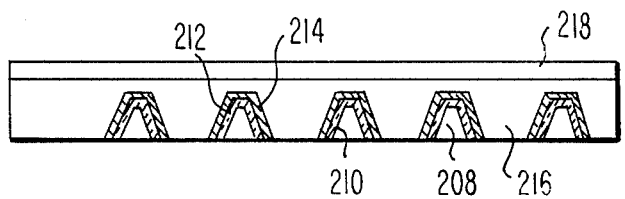

The mold 200 is then separated from the transparent material by mechanical lapping or dissolving the mold up to the etch-resistant layer 212 overlying the surface 206. The etch-resistant layer 212 and the metal layer 214 are then removed by mechanical polishing or lapping techniques, leaving the coated wedges 208 imbedded in the transparent material 216 as shown in FIG. 7. Alternatively the mold 200 can be removed completely including the wedge-shaped portions but it is preferable to leave the wedge-shaped portions of the mold intact for reinforcement purposes.

The completed reflector body 50 is aligned with the low response regions of the array between the elements of the array 10 and then adhered on the surface 16 of the semiconductor body 12 using a transparent adhesive layer, shown as 52 in FIG. 1.

The surface 103 of the array 100 may be fabricated using techniques similar to those used to form the projections on the mold 200. To form the $P^+$-type contacting layer 106, a P-type conductivity modifier is first diffused into the original surface of the body 102 to a depth greater than that of the wedges to be formed subsequently. Alternatively the wedges can be formed in a layer deposited using epitaxial techniques. The surface is then masked and etched as shown in FIG. 3 to form the wedges 104 projecting outward from the surface 103. The approach of diffusing the conductivity modified prior to the etching step insures that the contacting layer 106 extends a uniform distance into the body 102 from the surface 103. The surfaces of the wedges are then coated with a light reflective layer 108. The surface 103 between the wedges may be coated with an antireflection layer 110. These two layers are formed using standard photolithographic and vacuum evaporation techniques. In this case the alignment of the reflectors with the inactive regions between the elements of the array 100 is done at the initial masking step prior to the formation of the wedges.

It is to be understood that, while two different embodiments of the reflector means and methods of fabricating these embodiments have been disclosed, any reflector means positioned over the low response regions between elements of the array and projecting outward from the light entry surface are also within the scope of the invention.

In the operation of the array, light incident on the light entry surface of the low response regions between elements of the array is reflected by the coated wedges into the high response regions of the semiconductor body. The reflection of the incident light into the high response regions is particularly advantageous in an avalanche photodiode array since the avalanche gain falls off rapidly in the low response regions.

We claim:

1. In a photodetector array comprising a body of light-sensitive semiconductor material having a light entry surface and a plurality of spaced-apart elements therein, each of which includes a semiconductor junction, thereby forming a plurality of high response regions about said elements with low response regions therebetween;

the improvement comprising wedge-shaped regions with a light-reflective coating overlying the surfaces thereof and positioned over the low response regions for reflecting light incident thereon into a high response region of the body.

2. The array of claim 1 wherein the wedge-shaped regions comprise portions of the light entry surface of the semiconductor body over the low response regions having a wedge shape extending outward from the remainder of the surface.

3. The array of claim 1 wherein the elements of the array are avalanche photodiodes.

4. The array of claim 1 wherein the wedge-shaped regions extend a distance into a body of substantially transparent material from a surface thereof, said transparent body overlying said light entry surface and positioned such that the wedge-shaped regions extend outward from said light entry surface over said low response regions.

5. The array of claim 4 wherein a transparent plate overlies the transparent material.

6. The array of claim 5 wherein the elements of the array comprise avalanche photodiodes.

7. A method of fabricating a reflector comprising the steps of forming a plurality of wedge-shaped projections on the surface of a mold;

coating the surfaces of the wedge-shaped projections with a layer of a reflective material;

filling the space between the wedge-shaped projections with a substantially transparent material; and separating the mold from the transparent material with the reflective layer adhered to the transparent material.

8. The method of claim 7 wherein a layer of etch-resistant material is deposited on the surfaces of the projections and the surface of the mold between the projections before the step of coating the surfaces of the projections with the layer of reflective material.

9. The method of claim 8 wherein the step of separating the mold from the transparent material comprises dissolving the mold by chemical etching.

10. The method of claim 9 wherein the step of dissolving the mold is stopped before the portion of the mold in the wedge-shaped projections is dissolved.

11. The method of claim 10 wherein the mold is composed of crystalline silicon and the surface of the mold is a {100} crystallographic plane.

* * * * *